(12) United States Patent
Endo (10) Patent No.: US 6,331,378 B1
(45) Date of Patent: Dec. 18, 2001

(54) PATTERN FORMING METHOD

(75) Inventor: Masayuki Endo, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/212,412

(22) Filed: Dec. 16, 1998

(30) Foreign Application Priority Data

| Feb. 25, 1998 | (JP) | 10-043102 |
| Feb. 25, 1998 | (JP) | 10-043107 |

(51) Int. Cl.⁷ .................................................. G03F 7/00
(52) U.S. Cl. ..................... 430/314; 430/326; 430/330; 216/41; 438/705
(58) Field of Search .................................. 430/313, 314, 430/315, 317, 324, 325, 326, 330; 216/41, 49, 51, 58; 438/705, 706

(56) References Cited

U.S. PATENT DOCUMENTS

| 5,229,254 | * | 7/1993 | Lohaus et al. | 430/281 |
| 5,278,029 | * | 1/1994 | Shirai et al. | 430/325 |
| 5,322,764 | * | 6/1994 | Kamiyama et al. | 430/324 |
| 5,332,648 | * | 7/1994 | Kihara et al. | 430/270 |
| 5,403,695 | * | 4/1995 | Hayase et al. | 430/192 |
| 5,550,007 | * | 8/1996 | Taylor et al. | 430/314 |
| 5,763,124 | * | 6/1998 | Koizumi et al. | 430/30 |
| 5,928,839 | * | 7/1999 | Rath et al. | 430/313 |
| 6,017,683 | * | 1/2000 | Endo et al. | 430/326 |
| 6,074,804 | * | 6/2000 | Endo | 430/322 |

FOREIGN PATENT DOCUMENTS

| 5-11457 | 1/1993 | (JP) . |
| 9-230606 | 9/1997 | (JP) . |
| 10-10752 | 1/1998 | (JP) . |

* cited by examiner

Primary Examiner—Kathleen Duda
(74) Attorney, Agent, or Firm—Eric J. Robinson; Nixon Peabody LLP (57) ABSTRACT

A substrate is coated with a chemically amplified negative resist, thereby forming a resist film on the substrate. The chemically amplified negative resist includes: a polymer containing an acrylic acid as a polymerization unit; an acid generator for generating an acid when irradiated with extreme ultraviolet radiation; and a cross-linking agent for cross-linking the polymer in the presence of an acid. Next, the resist film is exposed to extreme ultraviolet radiation to generate an acid in exposed portions of the resist film. Thereafter, the resist film is heated to generate cross-linkage in the exposed portions of the resist film. Subsequently, a silylation reagent is supplied onto the surface of the resist film to form a silylated layer on the surface of non-exposed portions of the resist film. And then the resist film is dry-etched using the silylated layer as a mask, thereby forming a resist pattern out of the non-exposed portions of the resist film.

5 Claims, 7 Drawing Sheets

PATTERN FORMING METHOD

BACKGROUND OF THE INVENTION

The present invention relates to a method for forming a resist pattern on a semiconductor substrate during a process of fabricating a semiconductor integrated circuit device.

In a conventional process of fabricating a semiconductor integrated circuit device, a resist pattern is formed by a photolithography technique using ultraviolet radiation. However, since a greater and greater number of semiconductor integrated circuit devices are integrated on a single chip with an increasingly higher density in recent years, the significance of fine-line patterning technique is growing day after day. In order to cope with such demand, the wavelength of exposing radiation used for photolithography should be further reduced.

Nevertheless, the shorter the wavelength of exposing radiation is, the more seriously the accuracy is affected by rays reflected from the substrate underlying a resist film and a level difference of the resist film. To avoid these adverse effects, according to a suggested pattern forming method, a surface resolution process is performed by forming a masking layer over the surface of a resist film and patterning the resist film using the masking layer. In accordance with this method, ArF excimer laser light (wavelength: 193 nm) is used as exposing radiation and a chemically amplified resist is used as a resist material.

Hereinafter, a method for forming a positive resist pattern by exposing a chemically amplified negative resist to ArF excimer laser light will be described with reference to FIGS. 4(a) through 4(c) and FIGS. 5(a) and 5(b).

Figure 4A:
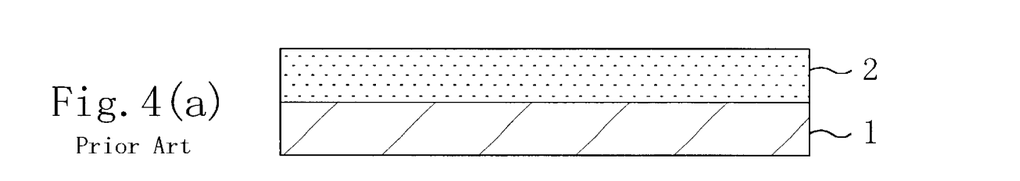
FIGS. 4(a) through 4(c) are cross-sectional views illustrating respective process steps of a conventional pattern forming method.
Figure 4B:
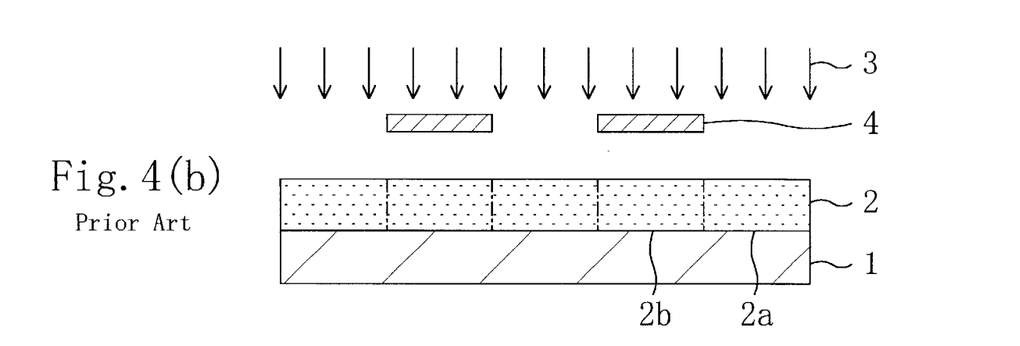

First, as shown in FIG. 4(a), the surface of a semiconductor substrate 1 is coated with a chemically amplified negative resist, thereby forming a resist film 2 thereon. The resist contains: polymers; an acid generator for generating an acid when exposed to radiation; and a cross-linking agent for cross-linking the polymers when heated in the presence of an acid. Thereafter, as shown in FIG. 4(b), the resist film 2 is exposed to excimer laser light 3 through a mask 4 having a desired pattern. As a result, an acid is generated from the acid generator in exposed portions 2a of the resist film 2.

Figure 4C:
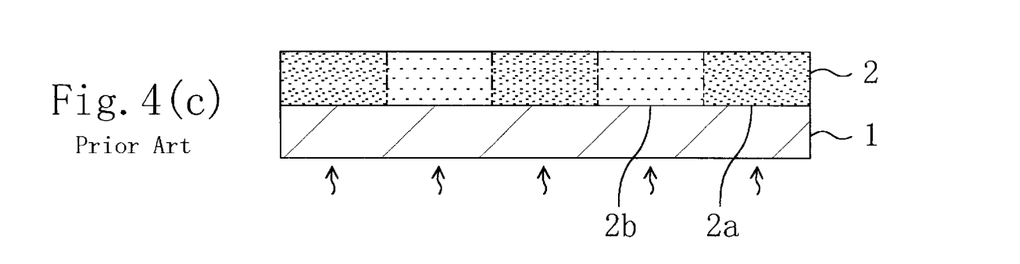

Then, as shown in FIG. 4(c), when the semiconductor substrate 1 and the resist film 2 are heated, the polymers are cross-linked in the exposed portions 2a owing to the function of the cross-linking agent, because the acid has been generated there. On the other hand, the polymers are not cross-linked in non-exposed portions 2b of the resist film 2, because no acid has been generated there.

Figure 5A:
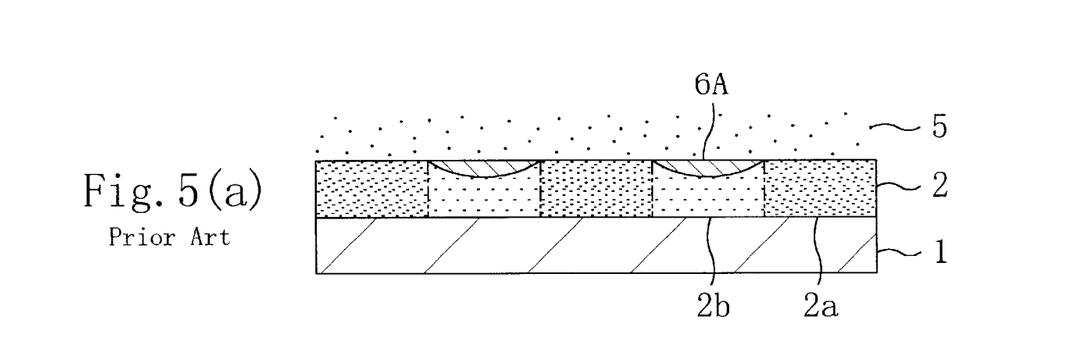
FIGS. 5(a) and 5(b) are cross-sectional views illustrating respective process steps of the conventional pattern forming method.

Next, as shown in FIG. 5(a), a silylation reagent 5, composed of dimethylsilyldimethylamine (DMSDMA) in vapor or liquid phase, is supplied onto the entire surface of the resist film 2. As a result, a silylated layer 6A is formed on the surface of the non-exposed portions 2b of the resist film 2. However, no silylated layer 6A is formed on the surface of the cross-linked, exposed portions 2a of the resist film 2.

Figure 5B:
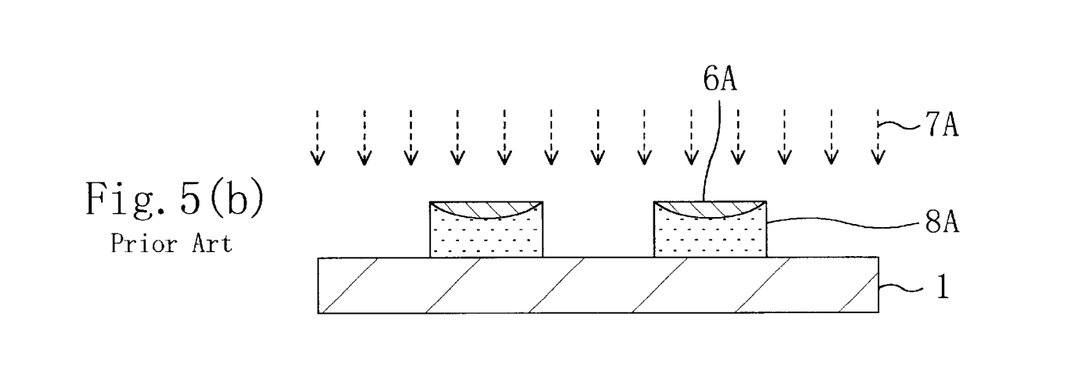

Subsequently, as shown in FIG. 5(b), the resist film 2 is dry-etched with an etching gas 7A, essentially consisting of $O_2$ gas, using the silylated layer 6A as a mask, thereby forming a positive resist pattern 8A out of the non-exposed portions 2b of the resist film 2.

In order to meet the demand for further increasing the degree of integration of, and further decreasing the size of, semiconductor integrated circuit devices, a method for forming a fine-line resist pattern with a line width of about 0.1 μm should be developed.

Thus, it is imaginable to use extreme ultraviolet radiation having a wavelength in the band of 13 nm or 5 nm, instead of ArF excimer laser light (wavelength: 193 nm), for the purpose of increasing the resolution of exposing radiation for a photolithography process.

Figure 6A:
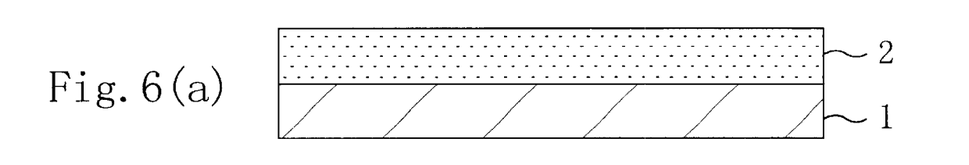
FIGS. 6(a) through 6(c) are cross-sectional views illustrating respective process steps of a pattern forming method as a basis of the present invention.

Hereinafter, a pattern forming method, considered by the present inventors as a basis of this invention, will be described with reference to FIGS. 6(a) through 6(c) and FIGS. 7(a) and 7(b). In the method, a positive resist pattern is formed by exposing, to extreme ultraviolet radiation, a resist film made of a chemically amplified negative resist having the following compositions:

Polymer: poly(vinyl phenol) (1 g)
Cross-linking agent: melamine (0.25 g)
Acid generator: triphenylsulfonium triflate (0.04 g)
Solvent: diglyme (5 g)

Figure 6B:
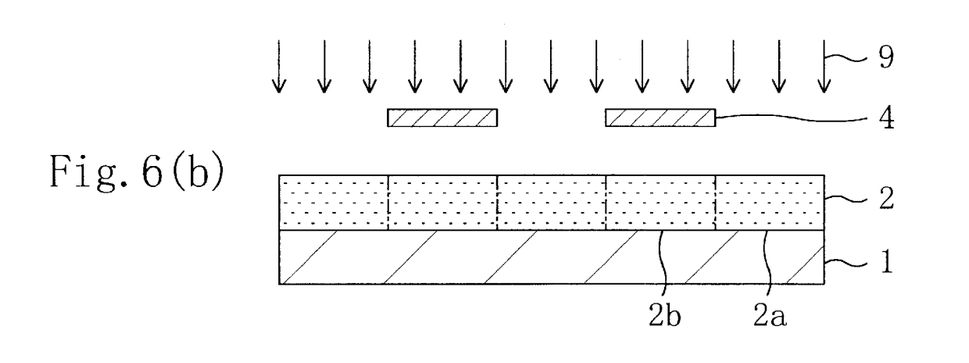

First, as shown in FIG. 6(a), a resist film 2 made of a chemically amplified negative resist and having a thickness of 0.5 μm is formed on a semiconductor substrate 1. Next, as shown in FIG. 6(b), the resist film 2 is exposed to extreme ultraviolet radiation 9, having a wavelength on the band of 13nm, using a mask 4, thereby generating an acid from the acid generator in exposed portions 2a of the resist film 2.

Figure 6C:
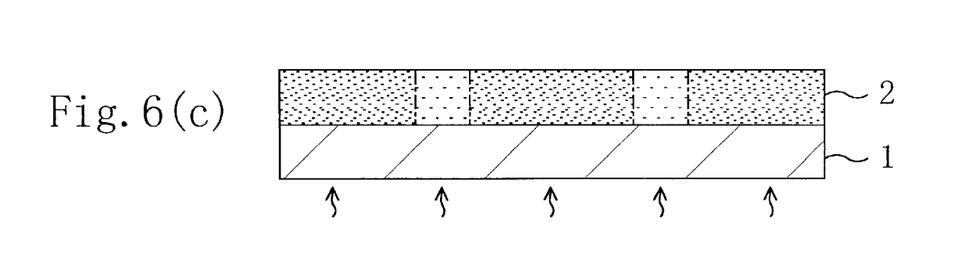

Then, as shown in FIG. 6(c), the semiconductor substrate 1 is heated by a hot plate at 100° C. for 60 seconds. As a result, the polymers react with the cross-linking agent owing to the function of the acid generated from the acid generator. Specifically, hydroxyl groups, which are cross-linking groups contained in the polymers, react with the cross-linking agent, whereby cross-linkage is generated in the exposed portions 2a of the resist film 2.

Figures 7A, 7B:
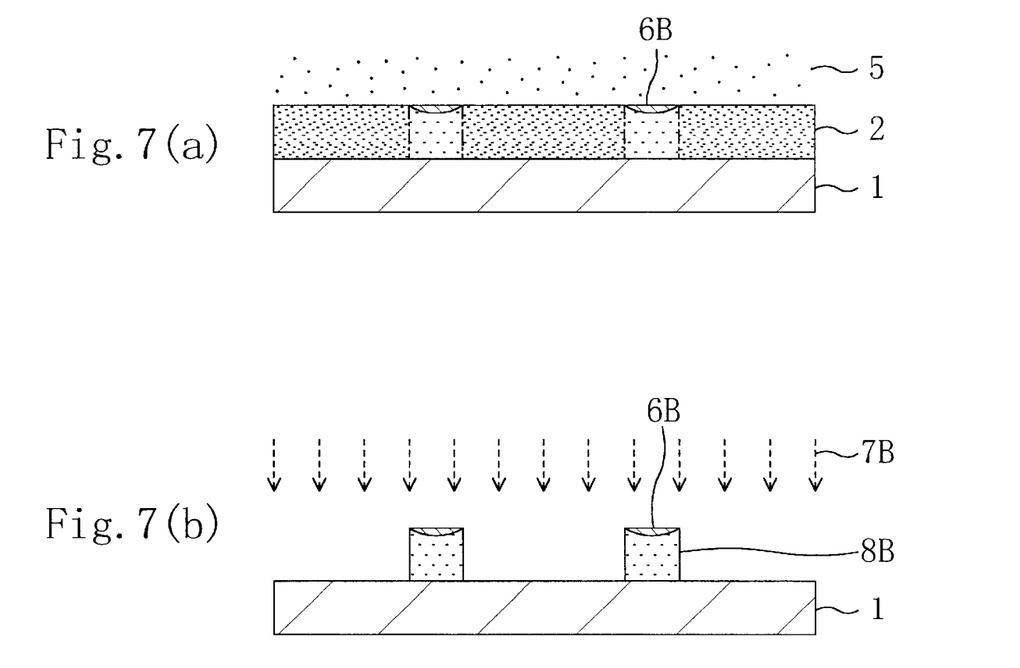
FIGS. 7(a) and 7(b) are cross-sectional views illustrating respective process steps of the pattern forming method as a basis of the present invention.

Subsequently, as shown in FIG. 7(a), a silylation reagent 5, composed of dimethylsilyldimethylamine (DMSDMA) in vapor or liquid phase, is supplied onto the entire surface of the resist film 2. As a result, a silylated layer 6B is formed on the surface of the non-exposed portions 2b of the resist film 2. However, no silylated layer 6B is formed in the cross-linked, exposed portions 2a of the resist film 2.

Thereafter, as shown in FIG. 7(b), the resist film 2 is dry-etched with an etching gas 7B, essentially consisting of $O_2$ gas, using the silylated layer 6B as a mask, thereby forming a positive resist pattern 8B out of the non-exposed portions 2b of the resist film 2.

However, the region of the resist film 2 where the polymers are cross-linked (i.e., the hatched regions with dense dots in FIG. 6(c)) covers not only the exposed portions 2a but also the non-exposed portions 2b. Accordingly, the size (i.e., width) of the silylated layer 6B is smaller than the size (i.e., width) of the non-exposed portions 2b of the resist film 2 as shown in FIG. 7(a). As a result, the size (i.e., width) of the resist pattern 8B is unintentionally smaller than the size (i.e., width) of the light-blocking portions of the mask 4 as shown in FIG. 7(b). Such a decrease in size accuracy of the resist pattern 8B causes various failures during subsequent process steps of a fabricating process of a semiconductor integrated circuit device.

SUMMARY OF THE INVENTION

In view of these problems, a prime object of the present invention is improving the size accuracy of a positive resist pattern obtained by exposing a resist film made of a chemically amplified negative resist to extreme ultraviolet radiation.

The present inventors analyzed from various angles why the polymer cross-linking region covers not only exposed portions but also non-exposed portions of a resist film. As a result, we made the following findings.

We observed that when a resist film was exposed to extreme ultraviolet radiation, an acid was also generated in part of non-exposed portions of the resist film abutting on the exposed portions thereof, though the amount of acid generated was smaller in the non-exposed portions than in the exposed portions. This is probably because the energy of extreme ultraviolet radiation is higher than that of ArF excimer laser light conventionally used.

That is to say, we found that since an acid had also been generated from the acid generator in that part of the non-exposed portions of the resist film abutting on the exposed portions thereof, the polymers were naturally cross-linked in that part when the resist film was heated. Our inventive concept is that the cross-linkage can be suppressed in that part of non-exposed portions of a resist film abutting on its exposed portions if polymers contained in a chemically amplified negative resist are limited to those exhibiting low cross-linking reactivity.

Another inventive concept of ours is that polymers contained in a chemically amplified resist film may be cross-linked only by the irradiation of extreme ultraviolet radiation thereto without heating, because the energy of extreme ultraviolet radiation is higher than that of ArF excimer laser light.

Specifically, a first pattern forming method according to the present invention includes the steps of: coating a substrate with a chemically amplified negative resist to form a resist film thereon, the chemically amplified negative resist including: a polymer containing an acrylic acid as a polymerization unit; an acid generator for generating an acid when irradiated with extreme ultraviolet radiation; and a cross-linking agent for cross-linking the polymer in the presence of an acid; exposing the resist film to extreme ultraviolet radiation to generate an acid in exposed portions of the resist film; heating the resist film to generate cross-linkage in the exposed portions of the resist film; supplying a silylation reagent onto the surface of the resist film to form a silylated layer on the surface of non-exposed portions of the resist film; and dry-etching the resist film using the silylated layer as a mask, thereby forming a resist pattern out of the non-exposed portions of the resist film.

In accordance with the first pattern forming method, the polymer containing an acrylic acid as a polymerization unit includes a carboxylic acid group as a cross-linking group, and shows low cross-linking reactivity, i.e., reactivity with the cross-linking agent. Accordingly, even when an acid is generated in part of the non-exposed portions of the resist film abutting on the exposed portions thereof, the polymer cross-linking region is limited to the exposed portions of the resist film.

A second pattern forming method according to the present invention includes the steps of: coating a substrate with a chemically amplified negative resist to form a resist film thereon, the chemically amplified negative resist including: a polymer containing a methacrylic acid as a polymerization unit; an acid generator for generating an acid when irradiated with extreme ultraviolet radiation; and a cross-linking agent for cross-linking the polymer in the presence of an acid; exposing the resist film to extreme ultraviolet radiation to generate an acid in exposed portions of the resist film; heating the resist film to generate cross-linkage in the exposed portions of the resist film; supplying a silylation reagent onto the surface of the resist film to form a silylated layer on the surface of non-exposed portions of the resist film; and dry-etching the resist film using the silylated layer as a mask, thereby forming a resist pattern out of the non-exposed portions of the resist film.

In accordance with the second pattern forming method, the polymer containing a methacrylic acid as a polymerization unit includes a carboxylic acid group as a cross-linking group, and shows low cross-linking reactivity, i.e., reactivity with the cross-linking agent. Accordingly, even when an acid is generated in part of the non-exposed portions of the resist film abutting on the exposed -portions thereof, the polymer cross-linking region is limited to the exposed portions of the resist film.

In the first or second pattern forming method, the polymer cross-linking region is limited to the exposed portions of the resist film. Accordingly, the size of the silylated layer formed on the surface of the resist film is substantially equal to that of the non-exposed portions of the resist film. As a result, the size accuracy of a resist pattern obtained by dry-etching such a resist film using the silylated layer as a mask can be considerably improved.

In an exemplary embodiment of the first pattern forming method, the polymer is preferably a copolymer of an acrylic acid and carboxylic acid ester. And in an exemplary embodiment of the second pattern forming method, the polymer is preferably a copolymer of a methacrylic acid and carboxylic acid ester.

A third pattern forming method according to the present invention includes the steps of: coating a substrate with a chemically amplified negative resist to form a resist film thereon, the chemically amplified negative resist including an acid generator for generating an acid when irradiated with extreme ultraviolet radiation and a cross-linking agent for cross-linking the polymer in the presence of an acid; exposing the resist film to extreme ultraviolet radiation to generate an acid in exposed portions of the resist film and to cross-link the polymer owing to a function of the acid generated; supplying a silylation reagent onto the surface of the resist film to form a silylated layer on the surface of non-exposed portions of the resist film; and dry-etching the resist film using the silylated layer as a mask, thereby forming a resist pattern out of the non-exposed portions of the resist film.

In accordance with the third pattern forming method, an acid is generated in the exposed portions of the resist film and the polymer is cross-linked owing to the function of the acid generated by exposing the resist film to extreme ultraviolet radiation. Accordingly, compared to heating the resist film after the pattern exposure, the cross-linkage of the polymer is suppressed. Thus, even when an acid is generated in part of the non-exposed portions of the resist film abutting on the exposed portions thereof, the polymer cross-linking region is limited to the exposed portions of the resist film. As a result, the size of the silylated layer formed on the surface of the resist film is substantially equal to that of the non-exposed portions of the resist film.

Consequently, the size accuracy of a resist pattern obtained by dry-etching such a resist film using the silylated layer as a mask can be considerably improved.

In an exemplary embodiment of the first to third pattern forming methods, the extreme ultraviolet radiation is light having a wavelength on the band of 13 nm or 5 nm.

In such an embodiment, the resolution of exposing radiation for a photolithography process can be increased with more certainty.

DESCRIPTION OF THE PREFERRED EMBODIMENTS

EMBODIMENT 1

Hereinafter, a pattern forming method according to a first embodiment of the present invention will be described with reference to FIGS. 1(a) through 1(c) and FIGS. 2(a) and 2(b).

In this first embodiment, a chemically amplified negative resist, including a polymer containing an acrylic acid as a polymerization unit and having the following compositions, is used:

Polymer: poly(acrylate(30 mol %)-methyl acrylate (70mol %)) (1 g)

Cross-linking agent: melamine (0.3 g)

Acid generator: triphenylsulfonium triflate (0.03 g)

Solvent: diethylene glycol dimethyl ether (5 g)

Figures 1A, 1B, 1C:
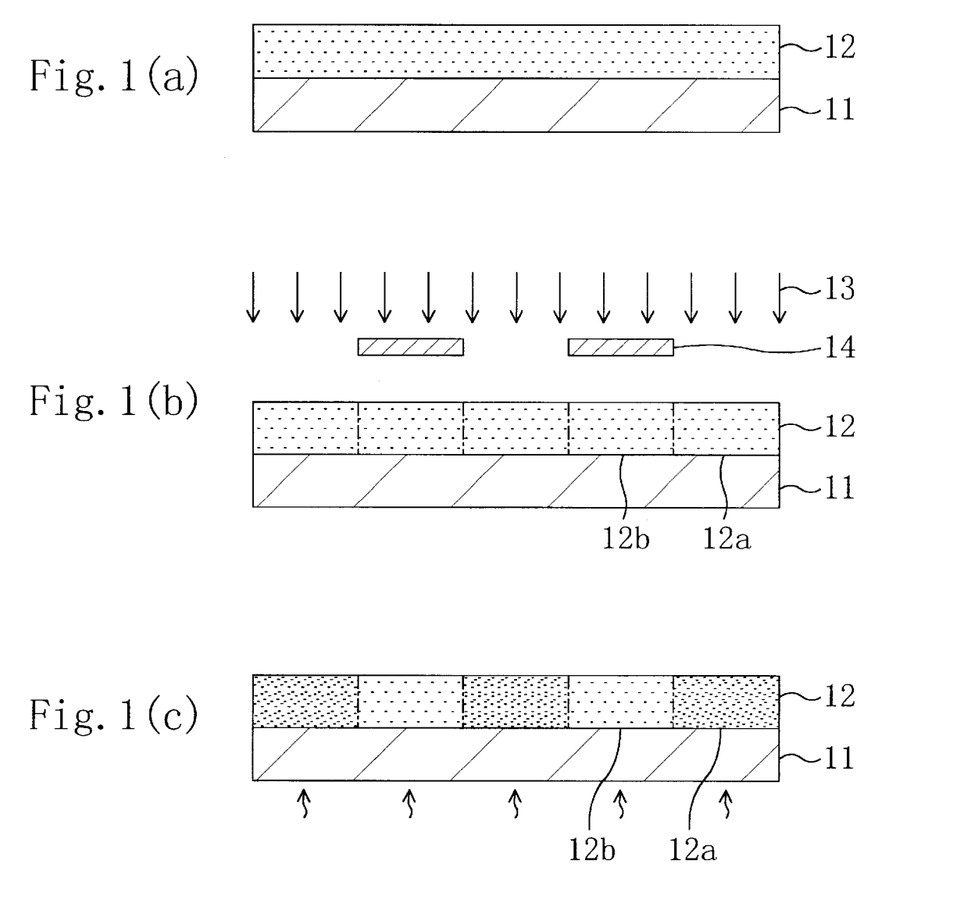
FIGS. 1(a) through 1(c) are cross-sectional views illustrating respective process steps for forming a pattern according to a first embodiment of the present invention.

First, as shown in FIG. 1(a), a resist film 12 made of a chemically amplified negative resist and having a thickness of 0.5 $\mu$m is formed on a semiconductor substrate 11. Next, as shown in FIG. 1(b), the resist film 12 is exposed to extreme ultraviolet radiation 13 having a wavelength on the band of 13 nm using a mask 14, thereby generating an acid from the acid generator in exposed portions 12a of the resist film 12.

Then, as shown in FIG. 1(c), the semiconductor substrate 11 is heated by a hot plate at 100° C. for 60 seconds. As a result, the polymers react with the cross-linking agent owing to the function of the acid generated from the acid generator. However, since an acrylic acid has a carboxylic acid as a cross-linking group, the polymer containing the acrylic acid as a polymerization unit has low reactivity with the cross-linking agent. Thus, even when an acid is generated from the acid generator in part of the non-exposed portions 12b of the resist film 12 abutting on the exposed portions 12a thereof, the polymer cross-linking region is limited to the exposed portions 12a of the resist film 12.

Figures 2A, 2B:
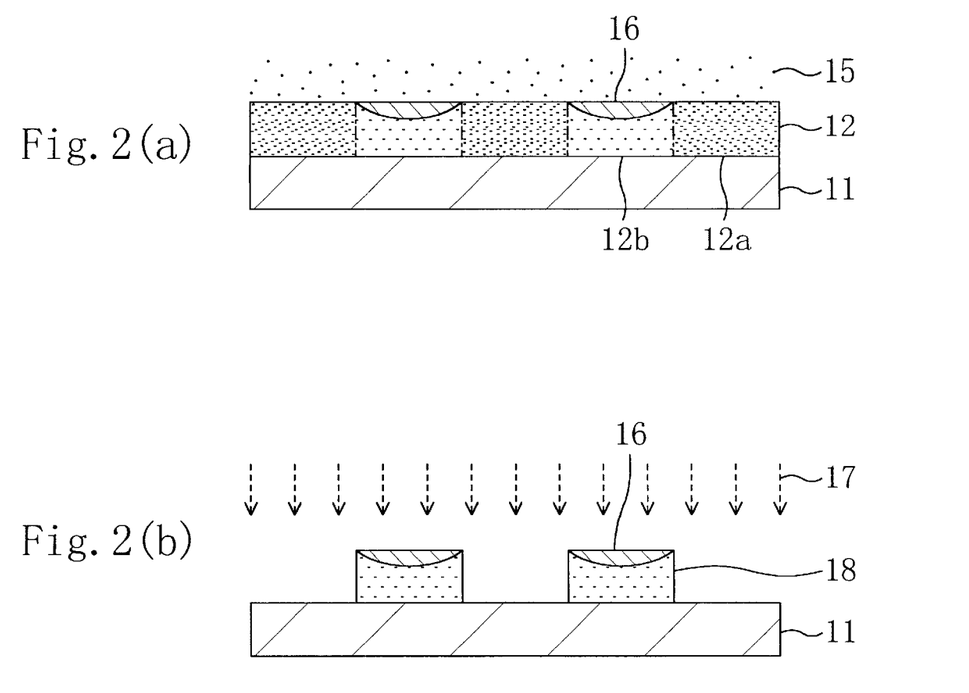
FIGS. 2(a) and 2(b) are cross-sectional views illustrating respective process steps for forming a pattern according to the first embodiment of the present invention.

Subsequently, as shown in FIG. 2(a), a silylation reagent 15, composed of dimethylsilyldimethylamine (DMSDMA) in vapor or liquid phase, is supplied onto the entire surface of the resist film 12. As a result, a silylated layer 16 is selectively formed only on the surface of the non-exposed portions 12b of the resist film 12.

Thereafter, as shown in FIG. 2(b), the resist film 12 is dry-etched with an etching gas 17, essentially consisting of $O_2$ gas, using the silylated layer 16 as a mask, thereby forming a positive resist pattern 18 out of the non-exposed portions 12b of the resist film 12.

In accordance with the first embodiment, the polymer cross-linking region is limited to the exposed portions 12a of the resist film 12. Accordingly, the size (i.e., width) of the silylated layer 16 formed on the surface of the resist film 12 is substantially equal to that of the non-exposed portions 12b of the resist film 12. As a result, a resist pattern 17 can be formed with excellent size accuracy.

Examples of the polymer contained in the chemically amplified negative resist used in the first embodiment include: polyacrylates containing an acrylic acid as a polymerization unit, e.g., a copolymer of an acrylic acid and carboxylic acid ester such as poly(acrylate (60 mol %)-tertiarybutyl acrylate (40 mol %)) or poly(acrylate (40 mol %)-methyl methacrylate (60 mol %)); and polymethacrylates containing a methacrylic acid as a polymerization unit, e.g., a copolymer of a methacrylic acid and carboxylic acid ester such as poly(methacrylate (35 mol %)-tricyclodecyl methacrylate (65 mol %)), poly(methacrylate (40 mol %)-methyl methacrylate (20 mol %) hydroxyethyl methacrylate (20 mol %)) or poly(methacrylate (30 mol %)-adamantyl methacrylate (50 mol %)-methyl methacrylate(2 mol %)).

Each of the polyacrylates containing an acrylic acid as a polymerization unit and the polymethacrylates containing a methacrylic acid as a polymerization unit includes a carboxylic acid as a cross-linking group, and therefore shows low cross-linking reactivity. Accordingly, even when an acid is generated in part of the non-exposed portions 12b of the resist film 12 abutting on the exposed portions 12a thereof, the polymer cross-linking region is limited to the exposed portions 12a of the resist film 12. Consequently, the size (i.e., width) of the silylated layer 16 formed on the surface of the resist film 12 is substantially equal to that of the non-exposed portions 12b of the resist film 12.

It is noted that the extreme ultraviolet radiation may be radiation on the band of 5 nm, instead of radiation on the band of 13 nm.

EMBODIMENT 2

Hereinafter, a pattern forming method according to a second embodiment of the present invention will be described with reference to FIGS. 3(a) through 3(d).

In this second embodiment, a chemically amplified negative resist having the following compositions is used:

Polymer: polyvinyl phenol)(1 g)

Cross-linking agent: melamine (0.25 g)

Acid generator: triphenylsulfonium triflate (0.04 g)

Solvent: diglyme

Figure 3A:
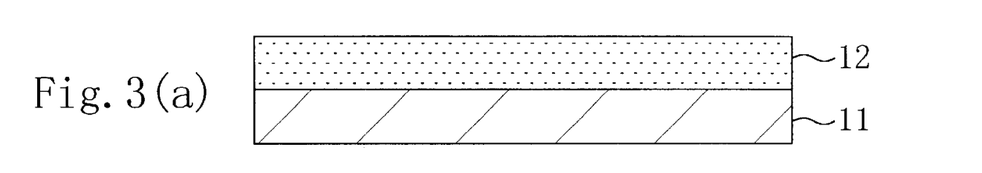
FIGS. 3(a) through 3(d) are cross-sectional views illustrating respective process steps for forming a pattern according to a second embodiment of the present invention.
Figure 3B:
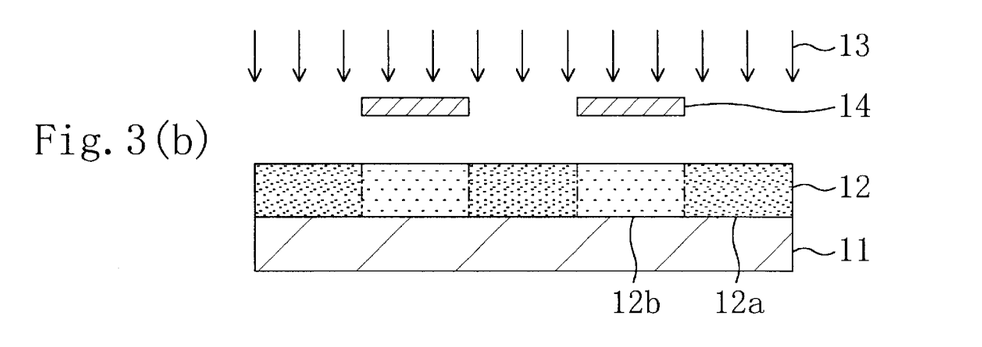

First, as shown in FIG. 3(a), a resist film 12 made of a chemically amplified negative resist and having a thickness of 0.5 $\mu$m is formed on a semiconductor substrate 11. Next, as shown in FIG. 3(b), the resist film 12 is exposed to extreme ultraviolet radiation 13 having a wavelength on the band of 13nm through a mask 14, thereby generating an acid from the acid generator in exposed portions 12a of the resist film 12 and cross-linking the polymers owing to the function of the acid generated. In this case, since the extreme ultraviolet radiation 13 has high energy, the polymers are cross-linked in the exposed portions 12a of the resist film 12 only by the irradiation of the extreme ultraviolet radiation without any heat treatment. Also, compared to heating the resist film after the pattern exposure, the cross-linkage of the polymers is suppressed. Accordingly, even when an acid is generated in part of the non-exposed portions 12b of the resist film 12 abutting on the exposed portions 12a thereof, the polymer cross-linking region is limited to the exposed portions 12a of the resist film 12.

Figure 3C:
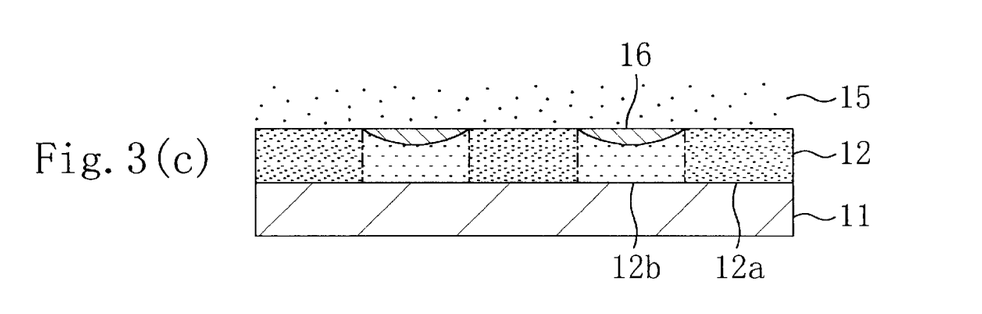

Subsequently, as shown in FIG. 3(c), a silylation reagent 15, composed of dimethylsilyldimethylamine (DMSDMA) in vapor or liquid phase, is supplied to the entire surface of the resist film 12. As a result, a silylated layer 16 is selectively formed only on the surface of the non-exposed portions 12b of the resist film 12.

Figure 3D:
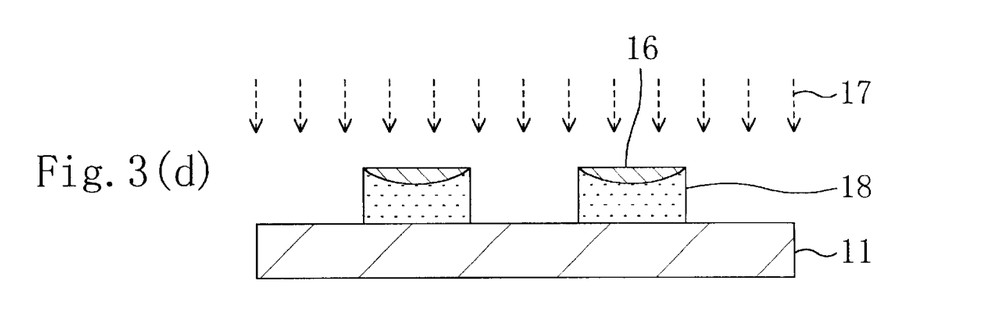

Thereafter, as shown in FIG. 3(d), the resist film 12 is dry-etched with an etching gas 17, essentially consisting of $O_2$ gas, using the silylated layer 16 as a mask, thereby forming a positive resist pattern 18 out of the non-exposed portions 12b of the resist film 12.

In accordance with the second embodiment, the polymer cross-linking region is limited to the exposed portions 12a of the resist film 12. Accordingly, the size (i.e., width) of the silylated layer 16 formed on the surface of the resist film 12 is substantially equal to that of the non-exposed portions 12b of the resist film 12. As a result, a resist pattern 17 can be formed with excellent size accuracy.

It is noted that the extreme ultraviolet radiation may be radiation on the band of 5 nm, instead of radiation on the band of 13 nm.

What is claimed is:

1. A pattern forming method comprising the steps of:
   coating a substrate with a chemically amplified negative resist to form a resist film thereon, the chemically amplified negative resist including: a polymer containing an acrylic acid as a polymerization unit; an acid generator for generating an acid when irradiated with extreme ultraviolet radiation; and a cross-linking agent for cross-linking the polymer in the presence of an acid;
   exposing the resist film to extreme ultraviolet radiation having a wavelength in the band of 13 nm or 5 nm to generate an acid in exposed portions of the resist film;
   heating the resist film to generate cross-linkage in the exposed portions of the resist film;
   supplying a silylation reagent onto the surface of the resist film to form a silylated layer on the surface of non-exposed portions of the resist film; and
   dry-etching the resist film using the silylated layer as a mask, thereby forming a resist pattern out of the non-exposed portions of the resist film.

2. The method of claim 1, wherein the polymer is a copolymer of an acrylic acid ad carboxylic acid ester.

3. A pattern forming method comprising the steps of:
   coating a substrate with a chemically amplified negative resist to form a resist film thereon, the chemically amplified negative resist including: a polymer containing a methacrylic acid as a polymerization unit; an acid generator for generating an acid when irradiated with extreme ultraviolet radiation; and a cross-linking agent for cross-linking the polymer in the presence of an acid;
   exposing the resist film to extreme ultraviolet radiation having a wavelength in the band of 13 nm or 5 nm to generate an acid in exposed portions of the resist film;
   heating the resist film to generate cross-linkage in the exposed portions of the resist film;
   supplying a silylation reagent onto the surface of the resist film to form a silylated layer on the surface of non-exposed portions of the resist film; and
   dry-etching the resist film using the silylated layer as a mask, thereby forming a resist pattern out of the non-exposed portions of the resist film.

4. The method of claim 3, wherein the polymer is a copolymer of a methacrylic acid and carboxylic acid ester.

5. A pattern forming method comprising the steps of:
   coating a substrate with a chemically amplified negative resist to form a resist film thereon, the chemically amplified negative resist including a polymer containing an acrylic acid as a polymerization unit, an acid generator for generating an acid when irradiated with extreme ultraviolet radiation and a cross-linking agent for cross-linking the polymer in the presence of an acid;
   exposing the resist film to extreme ultraviolet radiation having a wavelength in the band of 13 nm or 5 nm to generate an acid in exposed portions of the resist film and to cross-link the polymer owing to a function of the acid generated without heating;
   supplying a silylation reagent onto the surface of the resist film to form a silylated layer on the surface of non-exposed portions of the resist film; and
   dry-etching the resist film using the silylated layer as a mask, thereby forming a resist pattern out of the non-exposed portions of the resist film.

* * * * *